(12) United States Patent
Erdos et al.

(10) Patent No.: US 9,246,244 B2
(45) Date of Patent: Jan. 26, 2016

(54) RF CONNECTOR WITH PUSH-ON CONNECTION

(71) Applicant: DISH Network L.L.C., Englewood, CO (US)

(72) Inventors: David Eugene Erdos, Parker, CO (US); David Michael Lettkeman, Parker, CO (US)

(73) Assignee: DISH NETWORK L.L.C., Englewood, CO (US)

( * ) Notice: Subject to any disclaimer, the term of this patent is extended or adjusted under 35 U.S.C. 154(b) by 0 days.

(21) Appl. No.: 13/831,513

(22) Filed: Mar. 14, 2013

(65) Prior Publication Data

US 2013/0344735 A1 Dec. 26, 2013

Related U.S. Application Data

(63) Continuation-in-part of application No. 13/532,608, filed on Jun. 25, 2012.

(51) Int. Cl.
| | |
|---|---|
| H01R 24/00 | (2011.01) |
| H01R 33/22 | (2006.01) |
| H01R 9/05 | (2006.01) |
| H01R 13/17 | (2006.01) |
| H01R 24/50 | (2011.01) |
| G01R 1/04 | (2006.01) |

(52) U.S. Cl.
CPC .................. *H01R 9/05* (2013.01); *H01R 13/17* (2013.01); *H01R 24/50* (2013.01); *G01R 1/0416* (2013.01); *H01R 2201/20* (2013.01)

(58) Field of Classification Search
CPC .............................. H01R 33/22; H01R 13/052
USPC ............................ 439/661, 642, 825, 638, 63
See application file for complete search history.

(56) References Cited

U.S. PATENT DOCUMENTS

| | | | |
|---|---|---|---|
| 4,846,731 | A | 7/1989 | Alwine |
| 4,929,188 | A | 5/1990 | Lionetto et al. |

(Continued)

FOREIGN PATENT DOCUMENTS

| | | |
|---|---|---|
| EP | 0915536 A2 | 5/1999 |
| WO | 98/02937 A1 | 1/1998 |

OTHER PUBLICATIONS

TE Connectivity F Series and G Series RF Connectors, 414766-5 Product Details, found at http://www.te.com/catalog/bin/TE.Connect?C=11154&M=PPROP&P=&BML=&LG=1&PG=2&IDS= 128272,128392,385829,89408,84328,107120,84221,84744, 128275,372487,370975,370976,405649,405650,405655,405656, 405657,84743,84226,85237&N.

(Continued)

*Primary Examiner* — Hae Moon Hyeon
(74) *Attorney, Agent, or Firm* — Dorsey & Whitney LLP

(57) ABSTRACT

A radio frequency (RF) connector on a circuit board is provided. The RF connector includes a socket member, which includes a conductive sleeve comprising a top portion, a bottom portion, a plurality of springs connecting the top portion to the bottom portion. The RF connector also includes a base inside the conductive sleeve comprising a matching hole configured to match to a conductive pin of a plug member. The RF connector further includes an end portion electrically coupled to the circuit board. The end portion is mounted on the circuit board. The RF connector also includes a middle portion connected between the socket member and the end portion.

16 Claims, 6 Drawing Sheets

(56) References Cited

U.S. PATENT DOCUMENTS

| | | |
|---|---|---|
| 5,439,386 A | 8/1995 | Ellis et al. |
| 5,658,171 A | 8/1997 | Pauza et al. |
| 5,752,839 A * | 5/1998 | Fiacco et al. .................... 439/63 |
| 5,951,337 A * | 9/1999 | Brake .......................... 439/825 |
| 5,971,770 A * | 10/1999 | Richmond ...................... 439/63 |
| 6,174,206 B1 | 1/2001 | Yentile et al. |
| 6,227,868 B1 | 5/2001 | Wlodarski |
| 6,302,701 B1 | 10/2001 | Miller, Jr. et al. |
| 6,488,545 B1 | 12/2002 | Meyer |
| 6,719,586 B2 * | 4/2004 | Weidner ....................... 439/581 |
| 6,835,095 B2 * | 12/2004 | Chen ........................... 439/578 |
| 6,866,543 B2 * | 3/2005 | Chen et al. .................... 439/578 |
| 6,899,563 B1 | 5/2005 | Lee |
| 7,306,484 B1 * | 12/2007 | Mahoney et al. ............. 439/578 |
| 7,540,771 B2 * | 6/2009 | Lee et al. ...................... 439/581 |
| 7,677,929 B2 | 3/2010 | Bradford-Stagg |
| 7,871,295 B2 * | 1/2011 | Zhang et al. ................. 439/578 |
| 8,035,466 B2 | 10/2011 | Payne |
| 8,162,672 B2 * | 4/2012 | Huang ........................... 439/63 |
| 8,172,617 B2 | 5/2012 | Peng |
| 8,221,161 B2 | 7/2012 | Leibfried, Jr. |
| 8,323,058 B2 | 12/2012 | Flaherty et al. |
| 8,333,595 B2 * | 12/2012 | Uesaka et al. .................. 439/63 |
| 8,636,522 B2 * | 1/2014 | Sykes et al. .................... 439/63 |
| 8,647,128 B2 * | 2/2014 | Sykes et al. .................... 439/63 |
| 8,727,807 B2 * | 5/2014 | Sykes et al. ................... 439/578 |
| 2002/0142625 A1 * | 10/2002 | Berghorn et al. ............... 439/63 |
| 2006/0024993 A1 * | 2/2006 | Gonzalez ........................ 439/79 |
| 2008/0045043 A1 * | 2/2008 | Lee et al. ........................ 439/63 |
| 2009/0137133 A1 * | 5/2009 | Gou ............................... 439/63 |
| 2010/0176896 A1 | 7/2010 | Payne |
| 2011/0104910 A1 * | 5/2011 | Kadomatsu et al. ............ 439/63 |
| 2011/0165789 A1 * | 7/2011 | Sykes ........................... 439/352 |

OTHER PUBLICATIONS

PCT Search Report and Written Opinion, mailed Jun. 20, 2014, for International Application No. PCT/US2014/021999, 12 pages.

* cited by examiner

US 9,246,244 B2

RF CONNECTOR WITH PUSH-ON CONNECTION

CROSS-REFERENCE TO RELATED APPLICATION

The present application is a continuation-in-part application of U.S. patent application Ser. No. 13/532,608, entitled "RF Connector with Push-on Connection", filed on Jun. 25, 2012, which is incorporated herein by reference in its entirety.

TECHNICAL FIELD

The present invention generally relates to radio frequency (RF) connectors. More specifically, the invention relates to an RF connector with a first socket member configured to connect to a cable and a second socket member configured to connect to testing equipment.

BACKGROUND

An RF connector is an electrical connector that works at radio frequencies. RF connectors are typically used with coaxial cables and are designed to maintain the shielding that the coaxial design offers. Mechanically, the RF connector provides a fastening mechanism. There are various types of RF connectors including a female type RF connector and a male type RF connector. The female type (F-type) RF connector is generally a receptacle that receives and holds the male type RF connector. The female type RF connector is a connector that has a pin hole for receiving a conductive pin from a male type RF connector to provide electrical connection. The connector also includes mechanical fastening mechanism. For example, the female type RF connector may have outer threads configured to be received by the male type RF connector with inner threads.

One commonly used female type RF connector has two socket members adapted to connect to two plug members for male type RF connectors. Each plug member has a conductive pin, while a socket member has receptacle hole for receiving the conductive pin. Specifically, the plug member includes a protruding pin that fit into a matching hole in the socket member, where the hole may be sized to match to the protruding pin of the plug member. The plug member and the socket member are named based upon common electrical plugs and sockets. Generally, an electrical plug is a movable connector attached to an electrically operated device's power cord, and an electrical socket is fixed on equipment or a building structure.

FIG. 1 illustrates a side view of a conventional female type RF connector. As shown, conventional female type RF connector 100 includes a first socket member 102, a second socket member 104, and a middle portion 106 between the first socket member 102 and the second socket member 104. Inside the conventional connector 100, there is a pin hole 108 (shown as dash line) with a conductive contact 110. The pin hole 108 is configured to receive a conductive pin from a male type RF connector. The female type RF connector is fastened to the male type RF connectors through threads. The socket members 102 and 104 include outer threads 112 adapted to fasten to the male type RF connectors.

The female type RF connector 100 may be used to connect a cable to a testing equipment. For example, socket member 102 may be connected to the cable with a male type RF connector. Socket member 104 may be connected to a male type RF connector for the testing equipment.

It is desirable to have a more convenient way for connecting the testing equipment to the cable to improve testing efficiency. Thus, there remains a need for developing alternative female type RF connectors.

SUMMARY

Embodiments described herein may provide a female type RF connector with a push-on connection. The push-on connection allows quick removal and insertion of the RF connector to a testing cable. This saves an operator or a user time for connection of cables to a tester especially for frequent usage and improves testing efficiency.

In one embodiment, an RF connector is provided. The connector includes a first socket member. The first socket member includes a conductive sleeve comprising a top portion, a bottom portion, and a plurality of springs connecting the top portion and the bottom portion. The first socket member also includes a base inside the conductive sleeve comprising a first matching hole configured to match to a first conductive pin of a first plug member. The connector also includes a second socket member. The second socket member includes a second matching hole configured to match to a second conductive pin of a second plug member, and a conductive body having outer threads configured to match to inner threads of the second plug member. The connector further includes a middle portion connected between the first socket member and the second socket member. The middle portion extends radically outwardly from a periphery of the middle portion.

In another embodiment, an RF connector is provided. The connector includes a first socket member. The first socket member includes a conductive sleeve comprising a top portion, a bottom portion, and a plurality of springs connecting the top portion and the bottom portion. The first socket member also includes a base inside the conductive sleeve comprising a first matching hole configured to match to a first conductive pin of a first plug member. The connector also includes a second plug member. The second plug member includes a second conductive pin configured to match to a second matching hole of a second socket member, and a conductive body having outer threads configured to match to inner threads of the second plug member. The connector further includes a middle portion connected between the first socket member and the second plug member. The middle portion extends radically outwardly from a periphery of the middle portion.

In a further embodiment, an RF connector on a circuit board is provided. The RF connector includes a socket member, which includes a conductive sleeve comprising a top portion, a bottom portion, and a plurality of springs connecting the top portion to the bottom portion. The RF connector also includes a base inside the conductive sleeve comprising a matching hole configured to match to a conductive pin of a plug member. The RF connector further includes an end portion electrically coupled to the circuit board. The end portion is mounted on the circuit board. The RF connector also includes a middle portion connected between the socket member and the end portion.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

DETAILED DESCRIPTION

Figure 1:
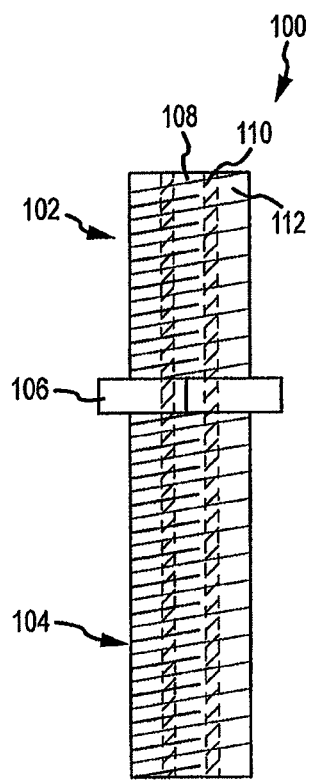
FIG. 1 illustrates a side view of a conventional female type RF connector.

The present disclosure may be understood by reference to the following detailed description, taken in conjunction with the drawings as briefly described below. It is noted that, for purposes of illustrative clarity, certain elements in the drawings may not be drawn to scale.

This disclosure provides a female type RF connector with a push-on connection. The push-on connection is configured to connect to a cable for testing. The female type RF connector may also include a socket member or a plug member configured to connect to a testing equipment. The socket member or the plug member is coupled to the push-on connection through a middle portion.

Figure 2A:
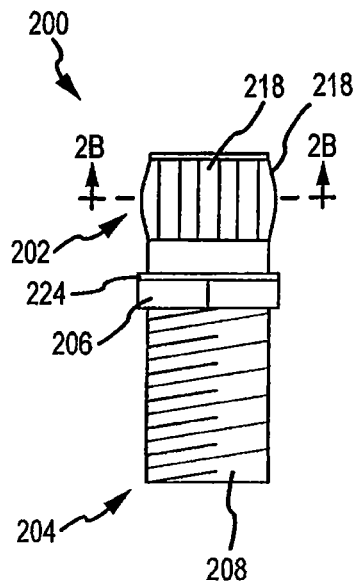
FIG. 2A illustrates a side view of an assembled female type RF connector in an embodiment.

FIG. 2A illustrates a side view of an assembled female type RF connector in an embodiment. A F-type RF connector 200 includes a first socket member or a push-on connection 202 configured to connect to a first plug member for a first male type RF connector, such as for a cable. The F-type RF connector 200 also includes a second socket member 204 configured to connect to a second plug member for a second male type RF connector, such as for a tester. The F-type RF connector 200 further includes a middle portion 206 between the first socket member 202 and the second socket member 204. The middle portion 206 functions as a stop for both the first plug member (see FIG. 6) and the second plug member (see FIG. 6). The middle portion 206 may be shaped like a nut. The second socket member 204 includes outer threads 208 to fasten to a plug member for a male type RF connector.

Figure 2B:
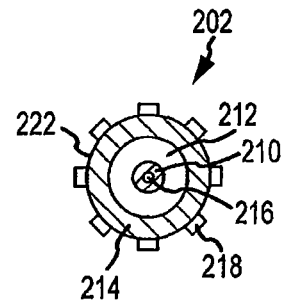
FIG. 2B illustrates a top view of the assembled female type RF connector of FIG. 2A.
Figure 4A:
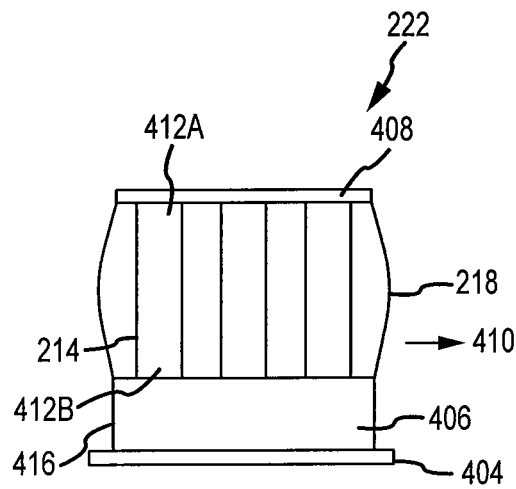
FIG. 4A illustrates a side view of a conductive sleeve in an embodiment.
Figure 4B:
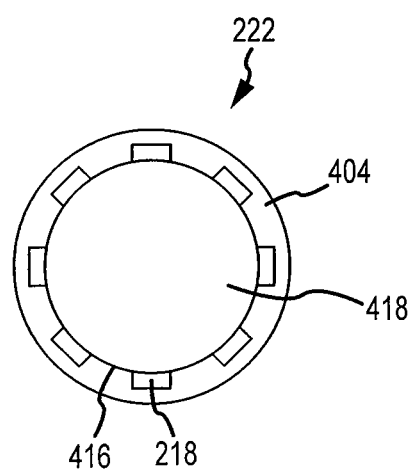
FIG. 4B illustrates a top view of the conductive sleeve of FIG. 4A.

FIG. 2B illustrates a sectional view of the F-type RF connector 200. As shown, the push-on connection 202 includes a conductive sleeve 222 having a number of springs 218 spaced on a periphery 220 of the push-on connection 202. An exemplary detailed structure of the conductive sleeve 222 is illustrated in FIGS. 4A-4B (see below). The push-on connection 202 may also include a flange 224, which may sit against the middle portion 206. The push-on connection 202 also includes a dielectric layer 212 inside the conductive sleeve 222. The push-on connection 202 further includes a conductive contact layer 210 surrounding a pin hole 216. The pin hole 216 may be sized to match a conductive pin of the first plug member. The conductive contact layer 210 contacts a conductive pin of the first plug member from a male type RF connector to provide electrical connection. The conductive sleeve 222 is configured to contact conductive threads of the first plug member to provide electrical connection. The dielectric layer 212 separates a conductive body layer 214 from the conductive contact layer 210. The dielectric layer 212 may be made of a plastic or an insulator. The conductive sleeve 222 may be formed of metal casting, such as zinc plated steel or other suitable metal alloy.

Figure 2C:
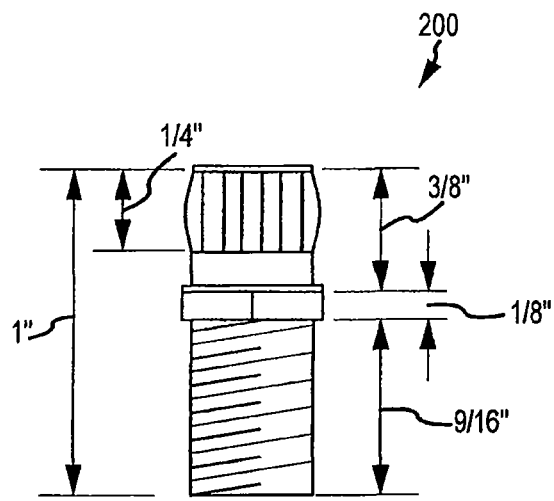
FIG. 2C illustrates exemplary dimension for assembled female type RF connector of FIG. 2A.

FIG. 2C illustrates exemplary dimensions of the F-type RF connector 200. As shown, the overall height of the connector 200 may be one inch. The springs 218 may be 0.25 inches long after being compressed and 0.375 inches long before being compressed. The middle portion 206 may have a height of 0.125 inches. The push-on connection 202 may be 0.375 inches high and the second socket member 204 may be 0.5625 inches high. It will be appreciated by those skilled in the art that the F-type RF connector may vary in shape and dimensions.

Figure 2D:
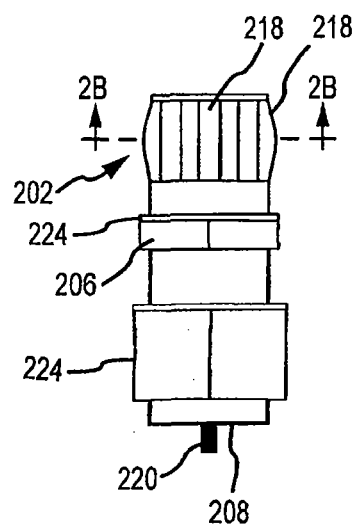
FIG. 2D illustrates a side view of an assembled female type RF connector with a male threaded end in an embodiment.

FIG. 2D illustrates a side view of an assembled female type RF connector with a male threaded end in an alternative embodiment. As discussed earlier, the second socket member 204 may be configured to connect to a second plug member for a second male type RF connector, such as for a tester. Alternatively, the second socket member 204 may be replaced by a second plug member that includes a male end with a pin 220. A nut 224 may have inner threads such that the nut 224 may fit to outer threads of any female socket member.

The F-type RF connector may be fabricated by assembling a base component and a conductive sleeve. FIG. 3A illustrates a side view of a base component for the F-type RF connector 200 in an embodiment. Base component 300A includes an adaptor base 302A and a second socket member 204. The adaptor base 302A is configured to have the conductive sleeve 222 to press fit on. For example, the adaptor base 302A may have an outer surface 304 without any threads such that the conductive sleeve 222 may be pressed fit to the outer surface 304. Base component 300A also includes a middle portion 206 between the adaptor base 302A and the second socket member 204. Again, the second socket member 204 includes outer threads 208 to fasten to a plug member for a male type RF connector.

Figure 3B:
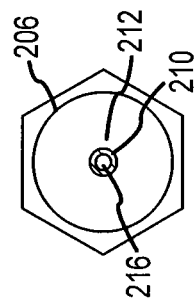
FIG. 3B illustrates a side view of a threaded base for a female type RF connector in an alternative embodiment.

FIG. 3B illustrates a side view of a threaded base for a female type RF connector 200 in an alternative embodiment. Base 300B is similar to base 300A except that the adaptor base 302B includes a top portion 310A without threads and a bottom portion 310B with threads 308. The conductive sleeve 222 may have inner threads that are matched to the outer threads 308 of the bottom portion 310B of the adaptor base 302B to help fasten the conductive sleeve 222 to the base 300B.

Figure 3D:
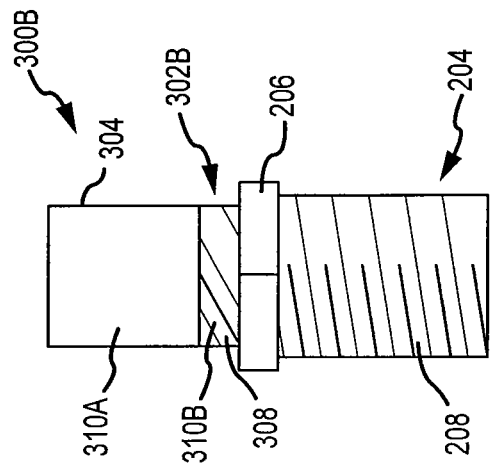
FIG. 3D illustrates a top view of the press fit base of the female type RF connector of FIG. 3A. in an alternative embodiment.
Figure 3A:
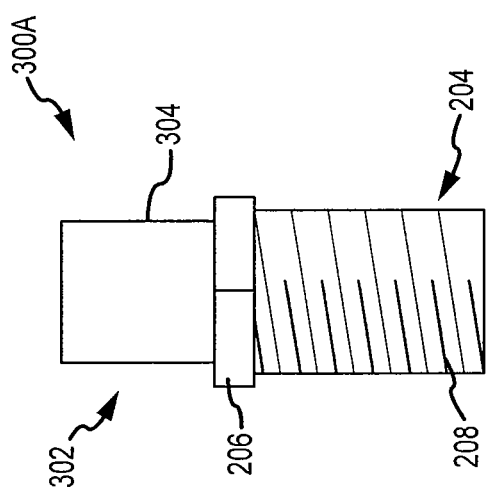
FIG. 3A illustrates a side view of a press fit base for a female type RF connector in one embodiment.
Figure 3C:
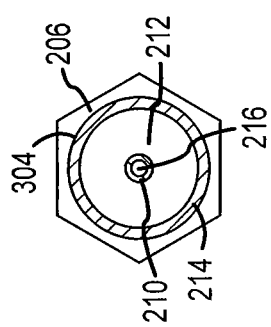
FIG. 3C illustrates a top view of the press fit base of the female type RF connector of FIG. 3A in one embodiment.

FIG. 3C illustrates a top view of the base component 300A or 300B in one embodiment. As shown, the adaptor base 302 includes a conductive body layer 214 enclosing dielectric layer 212 and inner conductive contact layer 210 surrounding pin hole 216. The conductive body layer 214 may be formed of metal casting, such as zinc plated steel or other suitable metal alloy. As shown in FIG. 3C, the middle portion 206 may be shaped like a nut. It will be appreciated by those skilled in the art that the middle portion may vary in shape or dimension.

FIG. 3D illustrates a top view of the base component 300A or 300B in another embodiment. As shown, the adaptor base 302 includes a dielectric layer 212 and inner conductive contact layer 210 surrounding pin hole 216. As shown in FIG. 3D, the middle portion 206 may be shaped like a nut. Note that the conductive body layer 214 shown in FIG. 3C may not be necessary, as the conductive sleeve 222 provides the electrical contact to a plug member. It will be appreciated by those skilled in the art that the middle portion may vary in shape or dimension.

The second socket member 204 may include outer conductive body layer 214 with outer threads 208. The second socket member 204 may also include dielectric layer 212 inside the outer conductive body layer 214 and inner conductive layer 210 enclosing pin hole 216. The pin hole 216 may be sized to match to a conductive pin of a second plug member. The outer conductive body layer with threads 208 are configured to fit into a hollow barrel of the second plug member.

The push-on connection 202 may be formed by pressing conductive sleeve 222 onto the adaptor base 302A or 302B of the base component 300A or 300B until the conductive sleeve 222 contacts the middle portion 206. FIG. 4A illustrates a side view of conductive sleeve 222 in an embodiment. The conductive sleeve 222 includes a number of springs 218 that are slightly bent extending outwardly in a radial direction as shown by arrow 410. The conductive sleeve 222 also includes a top portion 408 and a bottom portion 406 coupled to a flange 404 extending outwardly in a radial direction. Each spring 218 has a first end 412A connected to the top portion 408, and a second end 412B connected to the bottom portion 406. As shown in FIG. 4A, the springs 218 are arched such that the center of the springs extend the most distance. The springs 218 are configured to be flexible between two ends 412A and 412B. When the push-on connection 202 is pushed into a plug member for a male type RF connector, the springs 218 would be deformed to make contact with threads of the plug member.

The conductive sleeve 222 may be fabricated by cutting a number of strips from a cylindrical tube to form the springs 218. Then, the conductive sleeve 222 is compressed slightly to form the shape as shown in FIG. 4A.

FIG. 4B illustrates a sectional view of the conductive sleeve 222 in an embodiment. The flange 404 may be substantially circular shaped. The flange 404 may help attach the conductive sleeve 222 to the middle portion 206 of the F-type RF connector 200. The springs 218 are spaced along periphery 416 of the conductive sleeve 222. The conductive sleeve 222 includes an opening 418 inside the conductive sleeve 222 to receive the adaptor base 302A or 302B. The opening 418 may be sized to match to outer surface 304 of the base component 302A or 302B. Note that the springs 218 extend outwardly from periphery 416.

Figure 5:
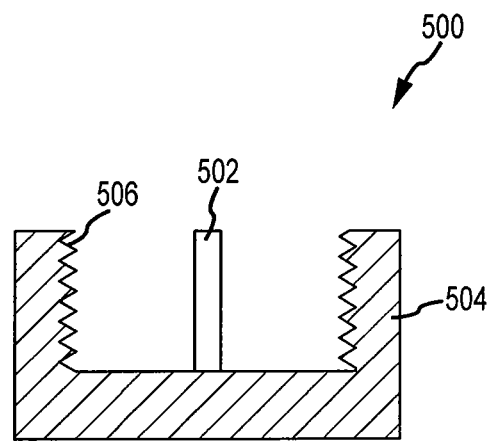
FIG. 5 illustrates a side view of a simplified plug member in one embodiment.

FIG. 5 illustrates a side view of a simplified second plug member 500 in an embodiment. The second plug member 500 may be used to connect to a tester. The second plug member 500 includes a conductive pin 502 and a conductive housing 504 with inner threads 506. The housing 504 is shaped like a hollow barrel and encloses the conductive pin 502. The second socket member 204 of the connector 200 is configured to match to the second plug member 500 such that the pin hole 216 receives the conductive pin 502 of the connector 200 and the outer threads 208 of the second socket member 204 tightens to the inner threads 506 of the plug member 500.

Figure 6:
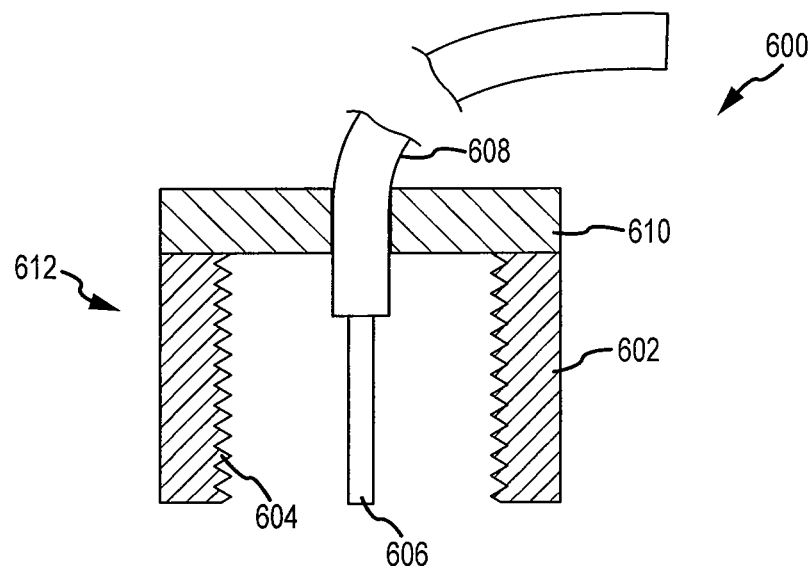
FIG. 6 illustrates a side view of a simplified plug member in another embodiment.

FIG. 6 illustrates a side view of a simplified first plug member 600 in another embodiment. The first plug member 600 includes a conductive housing 612 and a cable 608 coupled with a conductive pin 606. The conductive housing 612 also includes a first portion 602 shaped like a hollow barrel. The conductive pin 606 is enclosed within the hollow barrel. The housing 612 also includes a second portion 610 attached to the first portion 602. The first portion 602 has threads 604 inside the conductive housing 612. The second portion 610 includes an opening in a center of the second portion 610 configured to allow the cable 608 to pass through. The push-on connection 202 may be pushed into first plug member 600 such that the inner threads 604 of the first plug member 600 contact the springs 218 of the conductive sleeve 222 of the connector 200.

For testing a cable 608 using the F-type RF connector 200, the first plug member 600 is connected to the push-on connection or first socket member 202, while the second plug member 500 is connected to the second socket member 204 so that the cable 608 is connected to a tester (not shown). For testing multiple cables, the push-on connection 202 may be easily pulled out from the housing 612 of a first cable while the conductive pin 606 of the first cable 608 is separated from the matching hole 216 of the push-on connection or first socket member 202. Then, the push-on connection 202 may be easily pushed into a housing 612 of a second cable, while a conductive pin 606 of the second cable 608 is inserted into the matching hole 216 of the push-on connection or first socket member 202. Such "pull" and "push" actions are easier and faster than removal or insertion by threading. This type of F-type RF connector would save operator time especially for frequent removal of the cable from the RF connector.

In an alternative embodiment, the F-type RF connector 200 may also have a plug member as shown in FIG. 2D for connecting to testing equipment. For example, the testing equipment has a socket member (not shown). The plug member of the connector 200 may be an electrical plug with a conductive pin surrounded by a hollow barrel having threaded inside wall. The socket member of the testing equipment is configured to receive the conductive pin of the electrical plug of the connector 200. The socket member of the testing equipment also has outer threads configured to fasten against the threaded inside wall of the electrical plug or plug member of the connector 200.

Figure 7A:
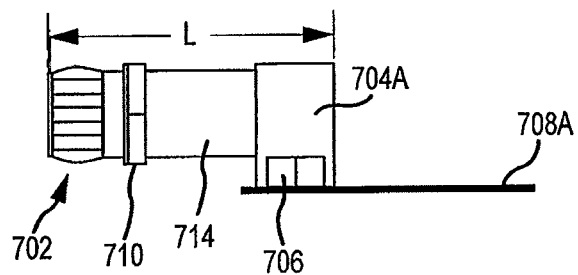
FIG. 7A illustrates an F-type RF connector mounted on a circuit board in one embodiment.

FIG. 7A illustrates an F-type RF connector mounted on a circuit board in one embodiment. As shown, the F-type RF connector 200 may include an end portion 704A that may be mounted on a circuit board 708A by using a mounting fixture 706, and may be substantially perpendicular to the circuit board 708A. The mounting fixture may be a clamping fixture that firmly attaches the end portion 704A of the RF connector to the circuit board 708A.

The F-type RF connector may have a push-on connection 702. The push-on connection 702 may be pushed into a plug member till stopped by a flange 710. The push-on connection 702 may be similar to that shown in FIGS. 4A and 4B. The RF connector may have a length "L" of about 1.5 inches.

In some embodiments, the end portion 704A may be an integrated part with the connection 714 between the flange and the end portion 704A. Alternatively, the end portion 704A may also be a separated part from connection 714. For example, connection 714 may have outer threads, such as those shown in FIGS. 2A, 2D. The end portion 704A may have an inner threaded hole configured to receive the outer threaded connection 714.

Figure 7B:
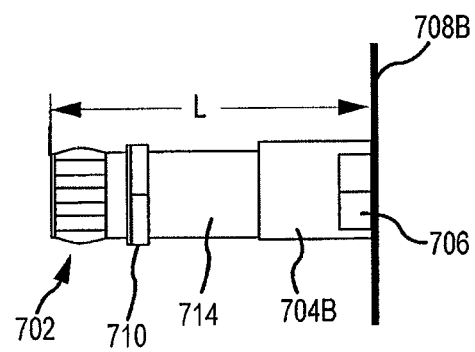
FIG. 7B illustrates an F-type RF connector mounted on a circuit board in another embodiment.

FIG. 7B illustrates an F-type RF connector mounted on a circuit board in another embodiment. As shown, the end portion 704B of the F-type RF connector 200 may also be mounted on a circuit board 708B, and may be substantially parallel to the circuit board 708B.

The push-on connection of the F-type RF connector can be easily inserted into the plug member or removed easily from the plug member. The springs may be durable even with frequent usage of the push-on connection. Comparing to the conventional threading connection, the easy insertion and removal of the push-on connection into the plug member saves a user setup time for any testing.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. An RF connector on a circuit board, the RF connector comprising:
    a socket member comprising
        a conductive sleeve comprising a plurality of springs, the conductive sleeve having a top portion, a bottom portion, and one or more inner threads; and
        a base inside the conductive sleeve, the base having one or more outer threads matched for engaging with the one or more inner threads, the top portion and bottom portion of the conductive sleeve contacting the base, the base comprising a matching hole configured to match to a conductive pin of a plug member; and
    an end portion coupled to the base and electrically coupled to the circuit board, wherein the end portion is mounted on the circuit board to secure the connector to the circuit board.

2. The RF connector of claim 1, wherein the end portion is configured such that the socket member is substantially perpendicular to the circuit board.

3. The RF connector of claim 1, wherein the end portion is configured such that the socket member is substantially parallel to the circuit board.

4. The RF connector of claim 1, wherein the plurality of springs are configured to contact inner threads of the plug member when the socket member is pushed against the plug member such that the conductive pin of the plug member fits into the matching hole of the socket member.

5. The RF connector of claim 1, wherein the base comprises a dielectric layer inside the conductive sleeve and a conductive inner layer between the dielectric layer and the matching hole.

6. The RF connector of claim 1, wherein the plurality of springs are configured to be spaced apart on a periphery of the socket member.

7. The RF connector of claim 1, wherein each spring comprises a strip shape with a first end and a second end, the first ends of plurality of the springs being connected to the top portion of the conductive sleeve and the second ends of the plurality of springs being connected to the bottom portion of the conductive sleeve.

8. The RF connector of claim 1, further comprising a clamping fixture that firmly attaches the end portion of the RF connector to the circuit board.

9. An RF connector on a circuit board, the RF connector comprising:
    a socket member comprising
        a conductive sleeve comprising a plurality of springs, the conductive sleeve having a top portion, a bottom portion, and one or more inner threads; and
        a base inside the conductive sleeve, the base having one or more outer threads matched for engaging with the one or more inner threads, the top portion and bottom portion of the conductive sleeve contacting the base, the base comprising a conductive inner layer surrounding a matching hole configured to receive a conductive pin of a plug member, a dielectric layer between the conductive sleeve and the conductive inner layer, wherein the conductive pin is enclosed by a housing of the plug member; and
    an end portion coupled to the base and electrically coupled to the circuit board, wherein the end portion is mounted on the circuit board to secure the connector to the circuit board, and the end portion is an integral portion of the socket member.

10. The RF connector of claim 9, wherein the end portion is configured such that the socket member is substantially perpendicular to the circuit board.

11. The RF connector of claim 9, wherein the end portion is configured such that the socket member is substantially parallel to the circuit board.

12. The RF connector of claim 9, wherein the plurality of springs are configured to contact inner threads of the plug member when the socket member is pushed against the plug member such that the conductive pin of the plug member fits into the matching hole of the socket member.

13. The RF connector of claim 9, wherein the base comprises a dielectric layer inside the conductive sleeve and a conductive inner layer between the dielectric layer and the matching hole.

14. The RF connector of claim 9, wherein the plurality of springs are configured to be spaced apart on a periphery of the socket member.

15. The RF connector of claim 9, wherein each spring comprises a strip shape with a first end and a second end, the first ends of plurality of the springs being connected to the top portion of the conductive sleeve and the second ends of the plurality of springs being connected to the bottom portion of the conductive sleeve.

16. The RF connector of claim 9, further comprising a clamping fixture that firmly attaches the end portion of the RF connector to the circuit board.

* * * * *